(12) United States Patent
Arami et al.

(10) Patent No.: US 11,562,891 B2
(45) Date of Patent: Jan. 24, 2023

(54) METHOD OF TEMPERATURE MEASUREMENT USED IN RADIO-FREQUENCY PROCESSING APPARATUS FOR SEMICONDUCTOR

(71) Applicant: PIOTECH INC., Shenyang (CN)

(72) Inventors: Junichi Arami, Shenyang (CN); Ren Zhou, Shenyang (CN)

(73) Assignee: PIOTECH CO., LTD., Shenyang (CN)

( * ) Notice: Subject to any disclaimer, the term of this patent is extended or adjusted under 35 U.S.C. 154(b) by 385 days.

(21) Appl. No.: 16/699,169

(22) Filed: Nov. 29, 2019

(65) Prior Publication Data

US 2020/0176231 A1    Jun. 4, 2020

(30) Foreign Application Priority Data

Nov. 29, 2018    (CN) .......................... 201811439218.1

(51) Int. Cl.
| | |
|---|---|
| *G01K 7/00* | (2006.01) |
| *H01J 37/32* | (2006.01) |
| *H01L 21/67* | (2006.01) |
| *G01K 7/16* | (2006.01) |
| *G01K 13/00* | (2021.01) |

(52) U.S. Cl.
CPC .......... *H01J 37/32724* (2013.01); *G01K 7/16* (2013.01); *G01K 13/00* (2013.01); *H01J 37/32183* (2013.01); *H01L 21/67248* (2013.01); *H01J 2237/2001* (2013.01)

(58) Field of Classification Search
CPC ........... H01J 37/32724; H01J 37/32183; H01J 2237/2001; C01K 7/16; G01K 13/00; H01L 21/67248
See application file for complete search history.

(56) References Cited

U.S. PATENT DOCUMENTS

| | | | | |
|---|---|---|---|---|
| 5,166,080 | A  * | 11/1992 | Schietinger | ........ G01B 11/0658 |
| | | | | 374/7 |
| 6,247,842 | B1 * | 6/2001 | Kitch | ...................... G01K 15/00 |
| | | | | 374/E7.018 |
| 2003/0112848 | A1 * | 6/2003 | Khan | ...................... G01J 5/0003 |
| | | | | 374/161 |
| 2009/0159572 | A1 * | 6/2009 | Salsich | ................ B23K 9/1006 |
| | | | | 219/121.36 |
| 2013/0045547 | A1 * | 2/2013 | Izawa | ............... H01J 37/32972 |
| | | | | 156/345.28 |
| 2015/0078416 | A1 * | 3/2015 | Pei | ..................... H01L 21/67248 |
| | | | | 374/119 |
| 2016/0111261 | A1 * | 4/2016 | Kabouzi | ........... H01J 37/32532 |
| | | | | 438/10 |

FOREIGN PATENT DOCUMENTS

| | | | | | |
|---|---|---|---|---|---|
| CN | 101874293 | B | * | 11/2011 | ........... C23C 16/345 |
| CN | 103095330 | A | * | 5/2013 | ............. H03D 3/008 |

(Continued)

*Primary Examiner* — Gail Kaplan Verbitsky
(74) *Attorney, Agent, or Firm* — Locke Lord LLP; Tim Tingkang Xia, Esq.

(57) ABSTRACT

A method for temperature measurement used in an RF processing apparatus for semiconductor includes generating by electrodes an RF signal sequence having multiple discontinuous RF signals that are separated by a time interval; and generating a temperature sensing signal by a thermal sensor during the time interval.

2 Claims, 4 Drawing Sheets

(56) References Cited

FOREIGN PATENT DOCUMENTS

| | | | | | |
|---|---|---|---|---|---|
| CN | 102577137 | B | * | 10/2014 | ........... H04L 1/0003 |
| EP | 0430559 | B1 | * | 3/1995 | |
| JP | 2011187636 | A | * | 9/2011 | |
| JP | 2017166824 | A5 | * | 9/2017 | |
| JP | 2020511822 | A | * | 4/2020 | |
| KR | 101258052 | B1 | * | 4/2013 | |
| SU | 1589260 | A1 | * | 8/1990 | |

\* cited by examiner

METHOD OF TEMPERATURE MEASUREMENT USED IN RADIO-FREQUENCY PROCESSING APPARATUS FOR SEMICONDUCTOR

RELATED APPLICATIONS

This application claims priority to China Application Serial Number 201811439218.1, filed on Nov. 29, 2018, which is incorporated by reference herein in its entirety.

BACKGROUND OF THE INVENTION

Field of the Invention

The present invention relates to a radio frequency (RF) processing apparatus for semiconductor, especially to the RF processing apparatus for semiconductor using a temperature measurement approach. More specifically, the present invention relates to a temperature measurement approach of a wafer heater pedestal.

Description of the Prior Art

Plasma processing equipment for wafer treatment includes RF control circuit. The RF control circuit is configured to provide and send RF signals to electrodes arranged within the plasma processing equipment, and thereby generate an electrical field in a processing region of a processing chamber. Reaction gas is ionized by the applied electrical field and then reacts with the wafer to be processed, resulting in such as etching or deposition. In general, RF control circuit includes an RF signal generator and an impedance matching circuit, wherein the impedance matching circuit has resistance component, capacitance component, inductance component or a combination thereof. The impedance matching circuit is well configured to match impedance of the RF signal source with impedance of the load side. The impedance matching circuit is configured to receive RF signals generated by the RF generator and then form RF signals adapted for the plasma processing apparatus through circuit modulation means.

In the known technique, electrodes and heating coils are able to be integrated into the wafer heater pedestal which can be served as a sending end or receiving end for RF signal. In one example, the main body of heater pedestal may be manufactured using a known ceramic stacking technique with electrodes, heating coils and conductors sealed therein. For the demand of zonal control, the electrodes and heating coils can be arranged in different zones of the pedestal. In some possible applications, function of the electrode and function of the heating coil can be realized by one single coil. To achieve wafer thermal control, the heating pedestal generally further includes at least one thermal sensor embedded therein used for sensing the local temperature within a pedestal zone. Said thermal sensor may be realized by the known resistance temperature detector (RTD). However, in practical operation, under the status where the RF signal in the plasma processing apparatus is activated, the thermal sensor of heating pedestal may not precisely reflect the true temperature of the pedestal, and this results in unexpected thermal control efficiency. This is because the thermal sensor operates with a current signal that is relatively small when compared with the intensity of the applied RF signal, and therefore the thermal sensor is more easily interfered by the RF signal and generates undesired noise signal, affecting the detection consequence.

In view of the above, it is required to develop a temperature measurement approach particularly for the semiconductor plasma apparatus to keep both plasma process and temperature measurement reliable at the same time.

SUMMARY OF THE INVENTION

The object of the present invention is to provide a method of temperature measurement used in radio frequency (RF) processing apparatus for semiconductor, wherein the RF processing apparatus has a pair of electrodes for generating plasma and a heater for supporting wafer, the heater has at least one thermal sensor and at least one heating coil. The method includes generating, by the pair of electrodes, an RF signal sequence that includes multiple discontinuous RF signals, wherein any one of the RF signals is separated from its next one with a time interval; and generating, by the at least one thermal sensor, a sensing signal within the time intervals.

In a preferred embodiment, the time interval is determined by a time constant associated with a value of heat resistance between a surface of the heater and the at least one heating coil.

In a preferred embodiment, the time interval is determined by a time constant associated with a value of heat capacitance between a surface of the heater and the at least one heating coil.

In a preferred embodiment, the time interval is less than one tenth of the time constant.

BRIEF DESCRIPTION OF THE DRAWINGS

The foregoing invention and other features and advantages will be more understood with reference to the following described embodiments and drawings.

DETAILED DESCRIPTION OF THE PREFERRED EMBODIMENTS

The following description will explain the present invention more fully with reference to the appended drawings, and will show certain embodiments by way of examples. However, the subject matter of the present invention may be embodied in various forms, and the present invention shall not be limited by any exemplary embodiments disclosed herein. The embodiments described herein are for exemplary purposes only. Similarly, the present invention shall be construed in a reasonably broad manner. In addition, as the subject matter of the present invention may be embodied as a method, device or system, the embodiments described herein may include examples in the form of hardware, software, firmware or any combination thereof (but excluding software-only scenarios).

The phrase "in one embodiment" as used herein does not necessarily refer to the same embodiment being described. Similarly, the phrase "in another embodiment" does not necessarily refer to a different embodiment from the one being described. The claimed subject matter may include all the elements described in an exemplary embodiment, or a combination of part of the elements described in an exemplary embodiment.

Figure 1:
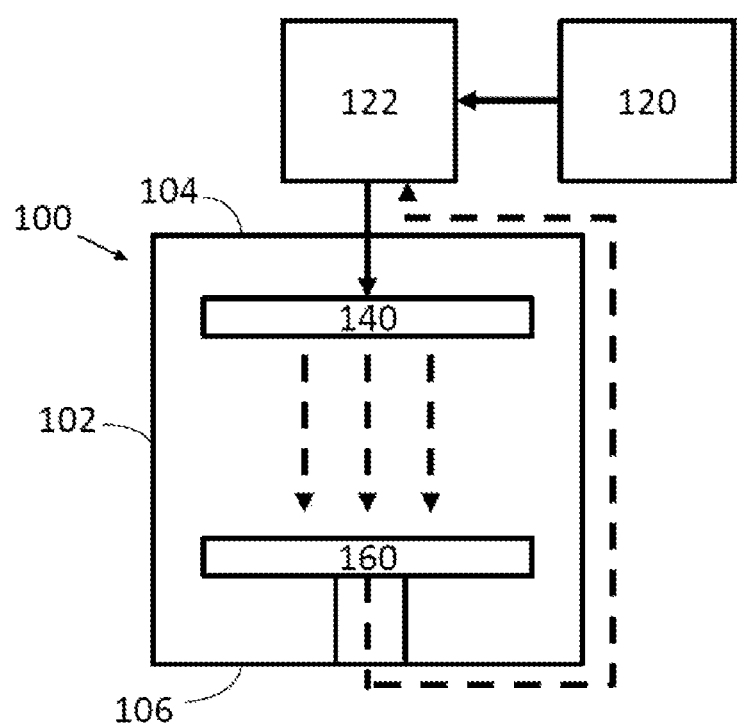
FIG. 1 is a block diagram schematically showing one embodiment of a semiconductor RF processing apparatus according to the present invention, in which an RF control circuit is coupled to an upper electrode.
Figure 2:
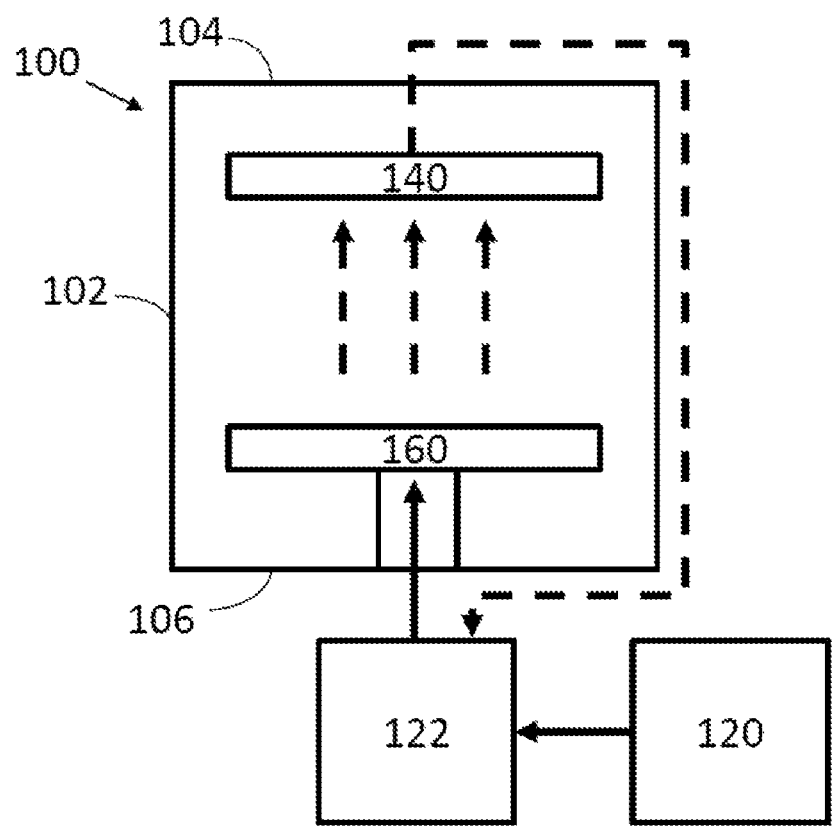
FIG. 2 is a block diagram schematically showing another embodiment of a semiconductor RF processing apparatus according to the present invention, in which an RF control circuit is coupled to a lower electrode.

FIG. 1 and FIG. 2 illustrate two schematic views of two embodiments of semiconductor RF processing apparatus, respectively. In these two configurations, said RF apparatus processing includes a housing 100 defining a chamber that accommodates various devices and members for various processes. The housing 100 has a side wall 102, a top 104 and a bottom 106. In general, the side wall 102 may couple to an exhaust system (not shown) configured to control pressure in the chamber. The top 104 may couple to a gas supply system (not shown) configured to supply reaction gases to the chamber. The bottom 106 may couple to a drive motor and a support assembly (not shown) configured to hold the wafer in the chamber. The housing 100 is entirely or partially conductive.

The RF processing apparatus according to the present invention includes an RF control device. As illustrated in the figures, said RF control device includes an RF signal generator 120 and a matching unit 122. The RF signal generator 120 has an output end electrically coupled to an input end of the matching unit 122. The matching unit 122 has an output end electrically coupled to an electrode in the housing 100. As illustrated in FIG. 1, the housing 100 is provided with an upper electrode 140 approximate the top 104, the matching unit 122 electrically coupled to the upper electrode 140. The matching unit 122 can couple to the upper electrode 140 via conductive wires through the housing 100. The upper electrode 140 can be included in a showerhead assembly. As illustrated in FIG. 2, the housing 100 is further provided with a wafer support or heating pedestal 160 approximate the bottom 106, and a lower electrode (not shown in the figure) is included in the heating pedestal 160 with the matching unit 122 electrically coupled thereto.

The RF signal generator 120 is configured to generate one or more RF signals. In one embodiment, the RF signal generator 120 can include one or more RF signal generating units, wherein each of the RF signal generating units has a work frequency different from that of one another. In the known technique, the RF signal generator 120 can be realized by at least one low frequency RF signal generating unit and at least one high frequency RF signal generating unit.

The matching unit 122 is configured to achieve an impedance match between the RF signal generator 120 and a load impedance within the housing. In general, the matching unit 122 includes an impedance matching circuit. In the known technique, to achieve the purpose of impedance match, control means may be used to control reactance of the impedance matching circuit. The impedance matching circuit receives one or more RF signals from the RF signal generator 120 and modulates the RF signals into an RF signal adapted for the plasma process which is provided to the upper or lower electrode of the housing 100.

In one embodiment, said RF control device further electrically couples to the housing 100. In the configuration of FIG. 1, where the matching unit 122 couples to the upper electrode 140, the lower electrode of the pedestal 160 is electrically coupled to the housing 100 via connectors (not shown) provided around the bottom 106. In the configuration of FIG. 2, where the matching unit 122 couples to the lower electrode of pedestal 160, the upper electrode 140 is electrically coupled to the housing via connectors provided around the top 104.

As discussed above, the applied RF signal can form a predetermined electrical field in a processing region between the upper electrode and the lower electrode, as depicted in the figure the dash arrows between the upper and lower electrodes. Reaction gases in the region is able to be ionized and used in various processes, such as etching or deposition. The RF signal passing through the upper and lower electrodes can return to the matching unit 122 along a return path as depicted in the figure a dash arrow extending from inside to outside of the housing. As illustrated in FIG. 1, when RF voltage applied to the upper electrode 140, the lower electrode may be configured to couple to ground or a reference voltage. On the opposite, when RF voltage applied to the lower electrode, the upper electrode may be configured to couple to ground or a reference voltage. Thus, vectors of the electrical filed are reversed as depicted in FIG. 1 and FIG. 2.

Figure 3:
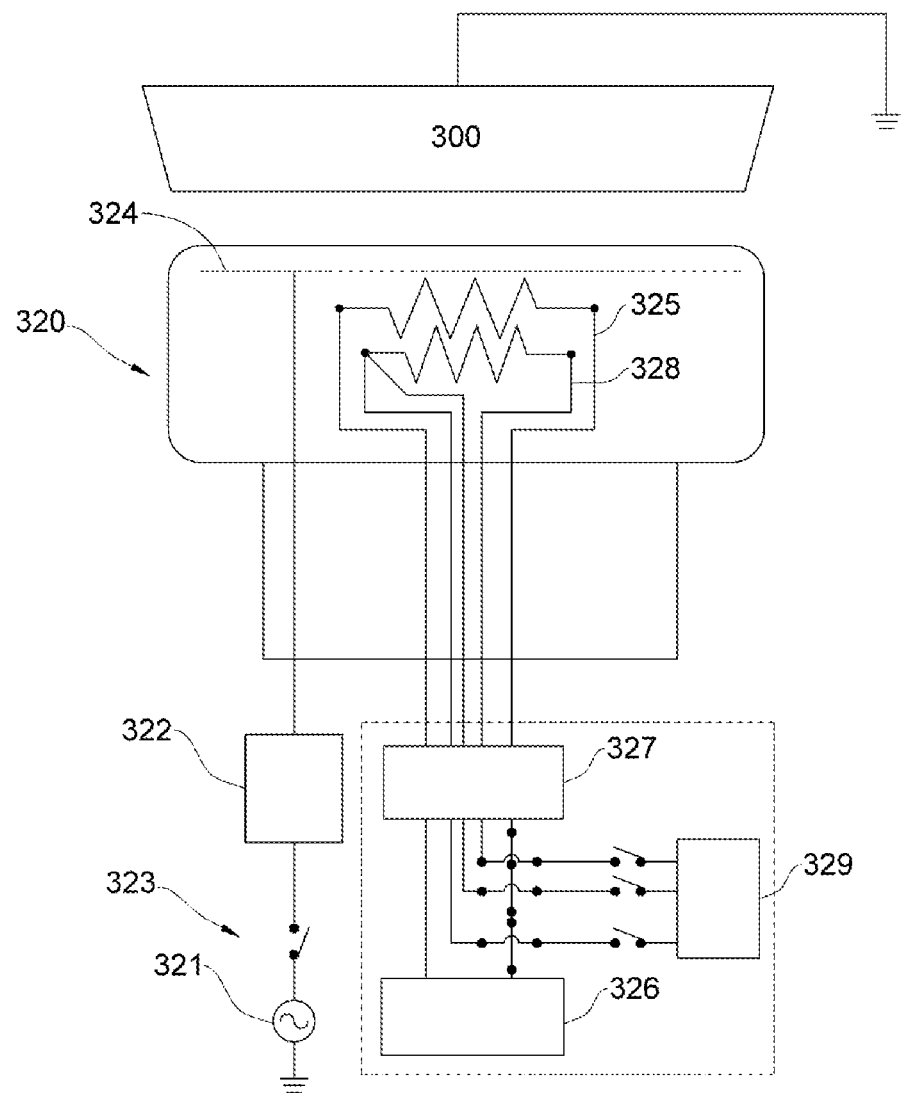
FIG. 3 is a block diagram schematically illustrating circuitry of the semiconductor RF processing apparatus according to the present invention, including an RTD circuit.

FIG. 3 schematically shows a block diagram of an RF processing apparatus according to the present invention, including a showerhead assembly 300 and a wafer pedestal 320, respectively served as the upper electrode and the lower electrode. The RF control device illustrated herein connects to the lower electrode of the wafer pedestal 320 while the upper electrode of showerhead assembly 300 connects to ground. Of course, in other embodiments, the foregoing configuration can be reversed. The RF control device includes a RF generator 321, a matching box 322 and a switch 323 interconnecting with the both. The matching box 322 connects to the lower electrode 324 of the pedestal 320 via conductive wires. The lower electrode 324 may be made of tungsten. The switch 323 can be realized by digital logic and optionally activate the RF signal. The switch 323 may be configured to periodically activate to produce an RF signal serious that is an RF signal sequence including multiple RF signals.

The wafer pedestal 320 is provided with a heater having at least one heating coil 325 or a patterned heating circuit. A power box 326 electrically connects to the heating coil 325 via a low pass filter 327 to supply a power signal that makes the heating coil 325 heated. In general, the heating coil 325 is disposed below the electrode 324 and made by tungsten in a specific pattern. In some embodiments, for the demand of zonal thermal control, more heating coils can be deployed in multiple independent zones of the pedestal. If so, each of the heating coils can connect to a respect power supply.

The heater of the wafer pedestal 320 further has at least one thermal sensor 328 disposed at a proper position within the heater with an area less than that of the heating coil 325. For example, the thermal sensor 328 can be disposed at a position between the lower electrode 324 and the heating coil 325 in the heater, or beneath the heating coil 325 over the respective heating zone. Said thermal sensor 328 is a resistive coil with proper width and length, which is electrically connected to a resistance temperature detector 329 (RTD) via several switches (not numbered). The RTD 329 based on a temperature-resistance relation resolves pedestal temperature measured by the thermal sensor 328. Thermal sensors 328 corresponding to different heating zones connects to the respective RTDs. The thermal sensor 328 may be made by one material selected from the group of platinum, copper, nickel and preferably tungsten. A controller (not shown) is used to control the power signal from the power box 326 and temperature of the heating coil 325 based on the temperature value read by RTD 329. In another feasible embodiment, the heating coil 325 may be served as said thermal sensor, i.e. the foregoing thermal sensor 328 may be removed while the heating coil 325 is electrically connected to the RTD 329, and the power box 326 is coupled to the RTD 329 in parallel.

Figure 4:
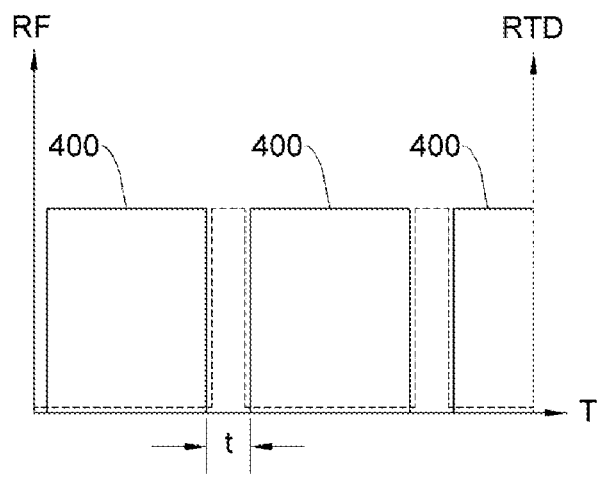
FIG. 4 shows an RF signal sequence based on a temperature measuring method of the present invention.

As discussed above, during generation of the applied RF signal, the RTD 329 may not precisely resolve the temperature value detected by the thermal sensor 328. The invention provides the switch 323 between the RF generator 321 and matching box 322 of the RF control device to thereby periodically produce RF signals, i.e. the RF signal sequence. FIG. 4 illustrates an RF signal sequence as mentioned above, which includes multiple discontinuous RF signals 400 along the timeline T. each of the RF signals 400 is separated from its previous and following RF signal with a time interval t. The value of RF signal within the time interval t is zero, representing no electrical field generated between the electrodes, i.e. the status of switch 323 is off. Beside the time intervals t, the value of RF signals within other time intervals is not zero, representing the electrical field is generated between the electrodes, i.e. the status of switch 323 is on. RTD 329 is configured to receive the sensed signals from the thermal sensor 328 during the time interval t. Therefore, the thermal sensor 328 will not be interfered by the RF signals or electrical field during the transformation from analogous temperature to digital signal, and the plasma process and the temperature modulation are able to coexist in the chamber without mutual interference.

Figure 5:
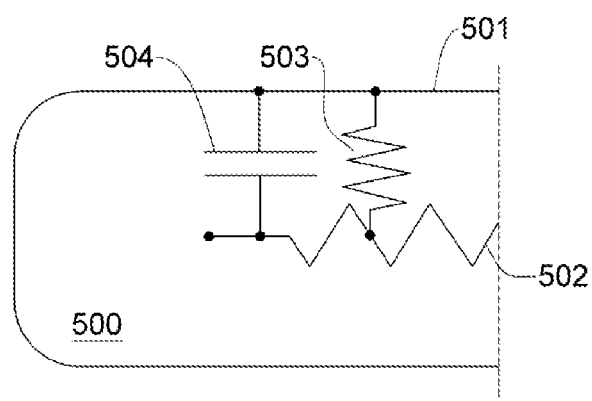
FIG. 5 is a schematic view showing an equivalent heat resistance and an equivalent heat capacitance in the heating pedestal.

FIG. 5 illustrates a schematic view of the heater according to the present invention. The heater 500 has a top surface 501 which is also a wafer carrying surface. It is noted that phenomenon including heat conduction and accumulation between the heating coil and/or thermal sensor 502 of the heater 500 and a surface of the heater 500 may exist. As illustrated in the figure, the heating coil and/or thermal sensor 502 and the top surface 501 may have heat resistance and heat capacitance, which means a heat resistance 503 and a heat capacitance 504 may exist between the heating coil and/or thermal sensor 502 and the top surface 501 with corresponding values of heat resistance (R) and heat capacitance (C). A time constant $\tau$ is determined, i.e. $\tau = R \times C$, where R and C are obtained by a measurement approach. In an example without limitation, after finishing the installation of the heater 500, provide a step function to heat the coil and measure the temperature feedback of the heater 500. Afterward, the values of heat resistance R and heat capacitance C are then determined by analyzing and computing the feedback data of temperature.

Each of time intervals t of the RF signal sequence is determined by the time constant $\tau$. In one embodiment, the time interval t is equal or less than the time constant $\tau$. In another embodiment, the time interval t is less than one tenth of the time constant $\tau$. In such way, the RTD 329 is guaranteed to obtain precise temperature value.

In summary, the present invention provides an approach for measuring temperature in an RF processing apparatus used for semiconductor manufacture, which utilizes a switch to generate multiple discontinuous RF signals and then uses the time intervals among the RF signals to sense the heater temperature to obtain precise detection results.

The foregoing content provides a complete description of combination and use of the described embodiments. These embodiments will exist within the following claims since more embodiments may be created without departure from the scope and spirit as described herein.

What is claimed is:

1. A method of temperature measurement used in radio frequency (RF) processing apparatus for semiconductor, wherein the RF processing apparatus has a pair of electrodes for generating plasma and a heater for supporting wafer, the heater has at least one thermal sensor and at least one heating coil, the method comprising:
   generating, by the pair of electrodes, an RF signal sequence that includes multiple discontinuous RF signals, wherein any one of the RF signals is separated from its next one with a time interval; and
   generating, by the at least one thermal sensor, a sensing signal within the time intervals,
   wherein the time interval is determined by a time constant associated with a heat resistance and a heat capacitance which are measured between a top surface of the heater and the at least one heating coil or between a top surface of the heater and the at least one thermal sensor, the time constant is the heat resistance multiplied by the heat capacitance.

2. The method as claimed in claim 1, wherein the time interval is less than one tenth of the time constant.

* * * * *